United States Patent
Lauxtermann et al.

(10) Patent No.: US 6,838,652 B2
(45) Date of Patent: Jan. 4, 2005

(54) ACTIVE CELL WITH ANALOG STORAGE FOR A CMOS TECHNOLOGY PHOTOSENSITIVE SENSOR

(75) Inventors: Stefan Lauxtermann, Berikon (CH); Georg Paul Israel, Wurenlos (CH)

(73) Assignee: CSEM-Centre Suisse d'Electronique et de Microtechnique SA - Recherche et Development, Neuchatel (CH)

( * ) Notice: Subject to any disclaimer, the term of this patent is extended or adjusted under 35 U.S.C. 154(b) by 63 days.

(21) Appl. No.: 10/264,711

(22) Filed: Oct. 4, 2002

(65) Prior Publication Data

US 2003/0062549 A1 Apr. 3, 2003

Related U.S. Application Data

(63) Continuation of application No. PCT/EP01/03841, filed on Apr. 4, 2001.

(30) Foreign Application Priority Data

Apr. 7, 2000 (FR) .......................................... 00 04494

(51) Int. Cl.[7] .......................................... H01L 31/062
(52) U.S. Cl. .............................. 250/208.1; 250/214.1; 257/297
(58) Field of Search .......................... 250/208.1, 214.1; 257/291, 59; 438/57; 348/30

(56) References Cited

U.S. PATENT DOCUMENTS 6,069,376 A * 5/2000 Merrill ........................ 257/291
6,297,070 B1 * 10/2001 Lee et al. ..................... 438/57
6,369,853 B1 * 4/2002 Merrill et al. ............... 348/302
6,555,842 B1 * 4/2003 Fossum et al. ............... 257/59

FOREIGN PATENT DOCUMENTS

| EP | 10322599 | 12/1998 |
| EP | 0905788 A2 | 3/1999 |
| WO | WO9319489 | 9/1993 |
| WO | WO9926408 | 5/1999 |
| WO | WO9966560 | 12/1999 |

OTHER PUBLICATIONS

A 128×128–Pixel Standard—CMOS Image Sensor With Electronic Shutter, by Chye Huat AW and Bruce A. Wooley, Fellow, IEEE, IEEE Journal of Solid–State Circuits, vol. 31, No. 12, Dec. 1996.

* cited by examiner

Primary Examiner—Stephone B. Allen
(74) Attorney, Agent, or Firm—Jacobson Holman PLLC

(57) ABSTRACT

An active cell for a photosensitive sensor that includes photosensitive diode in which the transistors of the cell are implemented using CMOS technology. The cell operates with an exposure phase in which the quantity of light impinging on the cell is detected followed by a scanning phase during which the luminance information caused by the impinging light is extracted from the cell. The cell is arranged in such a way to virtually completely isolate the charge accumulation node from the remainder of the cell after the exposure phase to eliminate stray accumulation of charge carriers.

5 Claims, 3 Drawing Sheets

ACTIVE CELL WITH ANALOG STORAGE FOR A CMOS TECHNOLOGY PHOTOSENSITIVE SENSOR

This is a continuation of PCT application Ser. No. PCT/EP01/03841 filed on Apr. 4, 2001.

BACKGROUND OF THE INVENTION

1. Field of the Invention

The present invention relates to an active cell for a CMOS technology photosensitive sensor comprising a plurality of such cells arranged in an addressable matrix in which the cells undergo successive working cycles consisting of at least an exposure phase to detect the quantity of light that impinges on them and then a scanning phase during which the luminance information due to that quantity of light is extracted from the cell.

2. Description of the Prior Art

A prior art cell of the above type is described in a paper by Huat et al. published in the IEEE Journal of Solid State Circuits, volume 11, N° Dec. 12, 1996.

That prior art cell comprises:

a photosensitive element, first addressable means for activating/deactivating said photosensitive element after said exposure phase, second addressable means for extracting from the cell, during said scanning phase, the luminance signal generated by said photosensitive element, third addressable means for transferring said luminance signal from said photosensitive element to said second addressable means;

memory means for retaining said luminance signal between the exposure phase and the time at which said cell is addressed to activate said second addressable means, and fourth addressable means for discharging said memory means after the cell reading phase, said photosensitive element and said first, second, third and fourth addressable means being implemented in the form of semiconductor components integrated into a substrate with predetermined conductivity types.

The above kind of cell has a shutter function that momentarily cancels the influence of the incident light during the waiting time that elapses between the exposure phase and the time at which the cell is read in the addressing order of the array in which it is incorporated. To implement this function, the luminance signal detected during the exposure phase is integrated in the memory means, which can be implemented in the form of a capacitor forming part of the cell. Because in this type of CMOS cell the luminance signal is an analog signal, it is important that the capacitor used in this way can retain the charge corresponding to the signal without distortion and without loss throughout the waiting time before the cell is read. Consequently, during this time, the capacitor must be isolated as well as possible from the remainder of the cell to prevent its charge leaking away. To this end, in the prior art cell described in the paper previously cited, the memory means implemented in the form of a capacitor are decoupled from the photosensitive element by the third addressable means immediately the exposure phase ends.

The prior art cell is implemented using transistors with the same type of conductivity (p-type conductivity), the photosensitive element being a $p^+$ diffusion region (see FIG. 4 in the paper). The transfer means, referred to in the paper as a "shutter", take the form of a p-type transistor whose source is a $p^+$ diffusion region to which is connected a node at which charges integrated during the exposure phase can accumulate, for example by virtue of the inherent stray capacitance of the node. However, the source implantation of the transfer or shutter transistor can also accumulate charges and divert them toward the substrate of the cell, resulting in distortion of the luminance signal really accumulated at the node and afterwards extracted from the cell, when it is addressed to read it. Another example of a prior art cell having the drawback of integrating stray charges is described in U.S. Pat. No. 5,900,623.

To reduce the influence of stray charge accumulation in the source implantation of the shutter transistor, it would be possible to increase the capacitance of the accumulation node, but this would necessitate the implementation of a capacitive region connected to the node. This solution would have the drawback of requiring too much space on the substrate, thereby reducing the filling coefficient thereof. Furthermore, although this would reduce the influence of stray charge accumulation, it would nevertheless remain present, and would nevertheless contribute to distortion of the luminance signal finally extracted from the cell at the time it is read.

SUMMARY OF THE INVENTION

An object of the invention is to provide an alternative solution to the above problem, which isolates the charge accumulation node virtually completely from the remainder of the circuit after the exposure phase, virtually eliminating stray accumulation without excessively increasing the overall size of the cell. One advantage resulting from the use of the invention is that the spectral characteristics of the photosensitive element are not degraded.

The invention therefore provides a cell as defined hereinabove which is characterized in that said third and fourth addressable means are placed in at least one well formed in the substrate, said at least one well having a first conductivity type opposite that of the substrate, which has a second conductivity type and in which the photosensitive element is produced.

Thanks to the above features, the charge carriers, which would tend to migrate toward the memory means during exposure of the cell, are stopped at the junction between the substrate and the well in which said addressable third means are disposed. Thus they cannot reach the node at which the charges representing the wanted luminance signal accumulate.

According to other advantageous features of the invention:

said first conductivity type is the p-type and the second conductivity type is the n-type;

said first conductivity type is the n-type and the second conductivity type is the p-type;

a diffusion region is implanted in said well and connected to a bias voltage source, which is preferably adjustable, said region having the second conductivity type;

said fourth addressable means are implanted in said well; and said third means consist in a plurality of transistors connected in series and each controlled by a fixed voltage.

Other features and advantages of the present invention will become apparent in the course of the following description, which is given by way of example only, and with reference to the accompanying drawings, in which:

DETAILED DESCRIPTION OF THE PREFERRED EMBODIMENTS

The cells represented in the figures are intended to form part of a photosensitive sensor implemented using the CMOS technology on a semiconductor substrate. The substrate includes a matrix comprising a large number of addressable cells organized in a manner that is known in the art, for example as shown in the FIG. 1 diagram of the paper previously cited.

Briefly, the operating principle of this kind of matrix, which is also known in the art, is as follows.

The matrix is subjected to successive cycles of observation of a scene, for example, each cycle comprising a phase of exposure of the sensor to light reflected from the scene, followed by a processing or acquisition phase during which the cells of the sensor are read in sequence by addressing the matrix. Thus the matrix can deliver a succession of row signals each comprising a variable voltage divided into samples each representing the luminance signal of one cell of the row concerned.

Obviously, the luminance signal generated in each cell during the exposure phase must be stored until the addressing of the matrix designates the cells concerned for reading, which storage is effected by accumulating charges in a capacitor in the cell.

Figure 1:
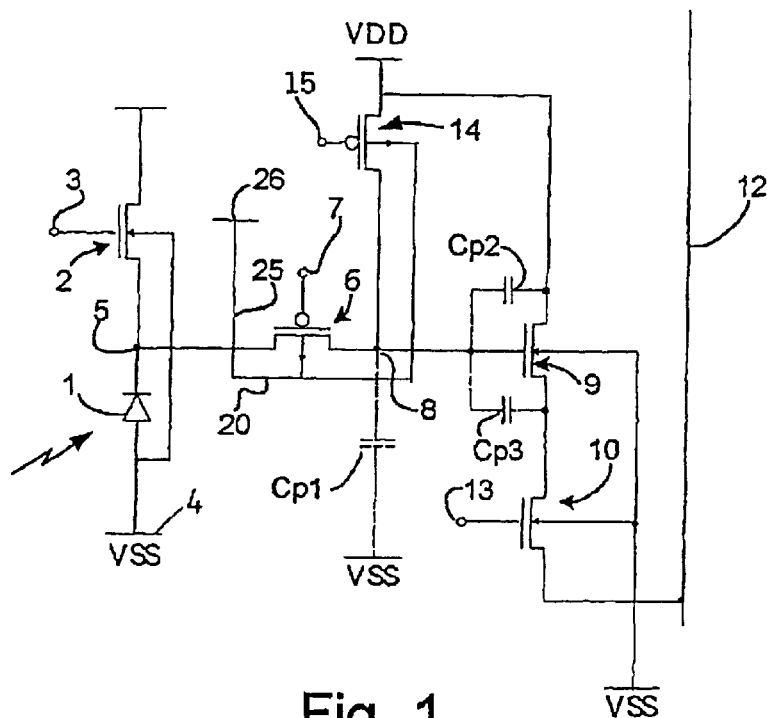
FIG. 1 is a diagram of a photosensitive sensor cell according to the invention, implemented using a p-type substrate technology.

Referring now to FIG. 1 in particular, it can be seen that a cell according to the invention comprises a photosensitive diode 1 connected in series with an n-type transistor 2 which constitutes the first addressable means of the cell and whose gate is connected to receive from a control terminal 3 a signal for deactivating the photodiode 1. The diode 1 and the transistor 2 are connected between ground and a supply voltage ($V_{SS}$) of the diode applied to a power supply terminal 4. The node 5 between the diode 1 and the transistor 2 is connected to a shutter transistor 6 which constitutes the third addressable means of the cell. The gate of the transistor 6 is connected to a shutter control terminal 7 of the cell. When it is conducting, the shutter transistor transfers to the charge accumulator node 8 a signal corresponding to the quantity of charges appearing at the node 5.

The charge accumulator node 8 is connected to the gate of a transistor 9 serving as a buffer amplifier, the transistor 9 being configured to convert the wanted luminance signal generated by the diode 1 and appearing in the form of a voltage at the node 8 into a current that can be extracted from the cell during the reading phase. The transistor 9 is connected in series with a read control transistor 10 between a power supply terminal ($V_{DD}$) 11 and an output line 12 which is a column line in the matrix of cells. The gate of the transistor 10 is connected to a read control terminal 13. The transistors 9 and 10 constitute the second addressable means of the cell.

The node 8 is connected to a plurality of stray capacitors cp1, cp2 and cp3. The capacitor cp1, which has the highest capacitance, is between the node 8 and ground, and the other two capacitors cp2 and cp3 connect the node 8 to either side of the transistor 9. In the embodiment shown, the stray capacitors constitute the memory means of the cell, and their total capacitance is generally sufficient to retain the charge after the exposure phase until the cell is read. If this were not the case in a given implementation, consideration could be given to integrating into the circuit of the cell a capacitor of appropriate capacitance, connected between the node 8 and ground, for example.

The node 8 is also connected to a reset transistor 14 (fourth means) which is intended to maintain the node 8 discharged between each reading and the next exposure phase of the cell. To this end the transistor 14 is controlled by a signal applied to a terminal 15 connected to its gate. The drain-source path of the transistor 14 is connected between the node 8 and the terminal $V_{DD}$.

Figure 2:
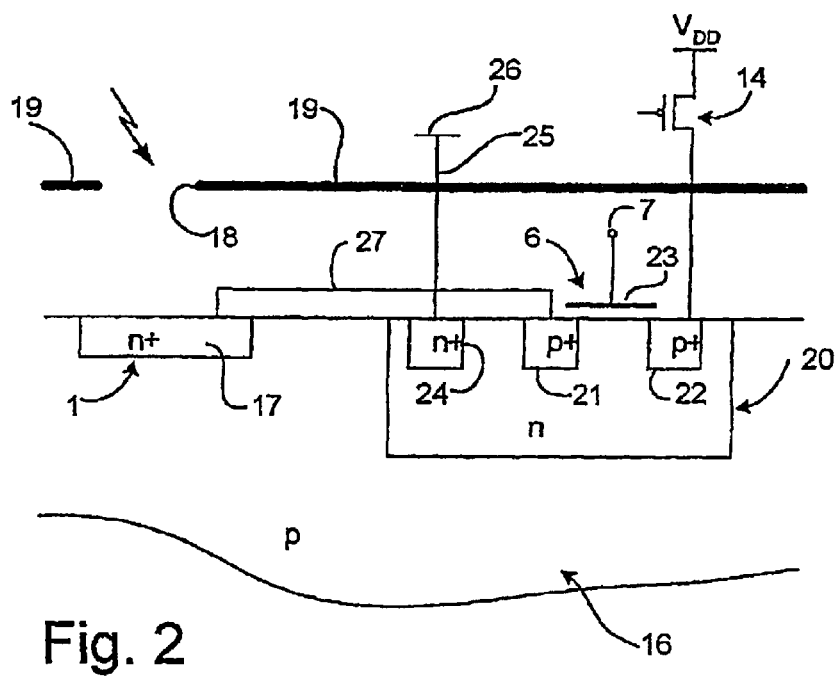
FIG. 2 shows diagrammatically one example of the implementation of a cell as shown in FIG. 1.

FIG. 2 shows partly and diagrammatically the implementation of the cell from FIG. 1. The cell is integrated on a p-type substrate 16 with a plurality of other cells (not shown), all the cells being identical, in a matrix that also includes all the addressing and power supply connections, for example as shown in the FIG. 4 diagram of the aforementioned paper.

To be more precise, the diode 1 comprises an $n^+$ region 17 formed in the substrate and placed behind an opening 18 in a screen 19 intended to reduce the liberation of charge carriers in the other components of the cell by the incident light. The screen 19 can be a final layer deposited on top of all the cells and having an opening 18 in front of each region 17. More generally, the photosensitive element 1 is a region or "photogate" which is adapted to collect the electrons generated by the light and which can be in an $n^+$ or $n^-$ doped area.

According to an essential feature of the invention, the shutter transistor 6 and the reset transistor 14 are placed in a well 20 of the opposite conductivity type to the substrate 16. The two transistors 6 and 14 can share the same well or be implemented in two separate wells with the same type of conductivity. In the example, the conductivity type is the n-type. In the well 20 are formed two $p^+$ diffusion regions 21 and 22 with the same conductivity type as the substrate and which form, with a gate 23 provided between them, the shutter transistor 6 (the transistor 14 is not shown in FIG. 2). There is also provided a third $n^+$ diffusion region 24 with the opposite conductivity type to the substrate, situated away from the $p^+$ diffusion regions 21 and 22. The third region 24 is used to apply a bias voltage to the well 20 via a connection 25 and a power supply terminal 26. In FIG. 1, the well 20 is symbolized by a conductor identified by the same reference number as in FIG. 2.

In the example, the diffusion regions 21 and 22 are of the $p^+$ type and the diffusion region 24 is of the $n^+$ type. It will also be noted that the transistor 14 is a p-type transistor. It can be formed in the well 20 or in another well, which in this example must be an n-type well, provided elsewhere in the substrate 16. It will also be noted that the node 5 is connected to the transistor 6 by a connection 27 external to the substrate 16.

When light impinges on the matrix of cells incorporating the cell just described, electrons liberated outside the impoverished area of the photodiode 1 migrate through the substrate 16 until they are trapped by the region 17 of the diode 1 or by the well 20 containing the p⁺ region, the latter in fact forming the node 8 However, as the well 20 is biased to a fixed voltage that is applied to via the terminal 26, the quantity of charge accumulated at the node 8 is not modified by these stray charges.

The time for which the wanted charge is retained at the node 8 depends essentially on the leakage current flowing in the diode formed between the p⁺ region 22 and the n-type well 20, the characteristics of the diode depending on the technology used. This is why an advantageous feature of the invention is to provide the facility for the designer to choose at will the bias voltage applied to the well 20 via the connection 25 and the terminal 26, in order to be able to adjust the charge retention time before the cell must be read optimally, by adjusting the bias voltage.

Figure 3:
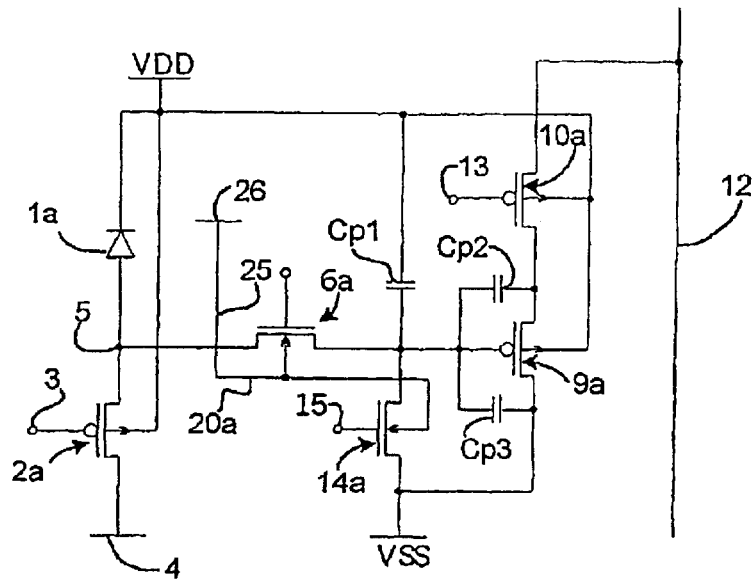
FIG. 3 is a diagram of a cell according to the invention implemented with an n-type substrate technology.
Figure 4:
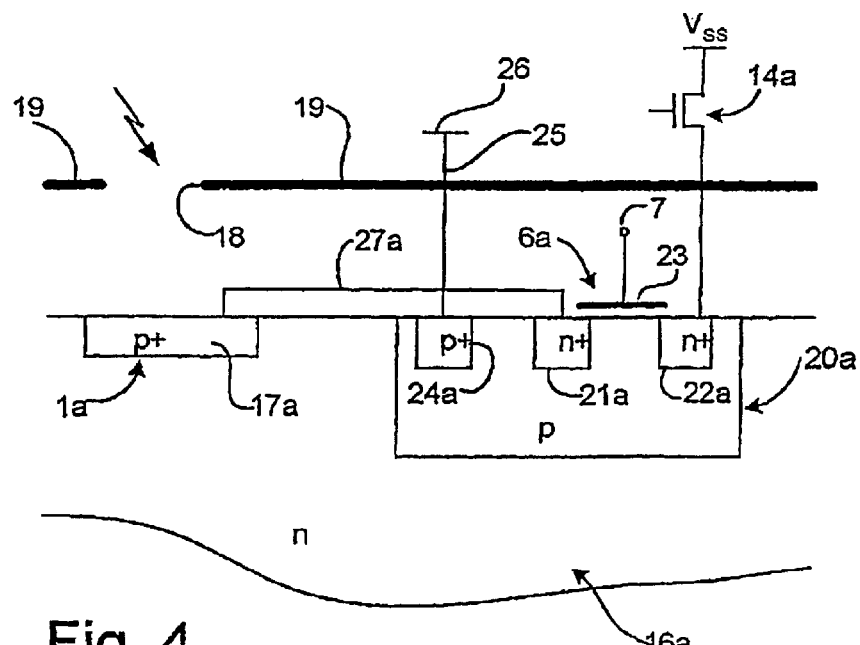
FIG. 4 is an example of the implementation of the cell from FIG. 3.

FIGS. 3 and 4 show an embodiment which constitutes a dual form of that from FIG. 1 in so far as the types of conductivity used are concerned. In these figures, components having the same function but the opposite conductivity type that they have in FIGS. 1 and 2 are designated by the same reference number with the suffix "a".

It is to be noted that the functions of the transistors 9 and 10 or 9a, 10a can equally be implemented by equivalent means situated outside the chip in which the matrix made up of cells according to the invention is formed. In this case, the corresponding transistors are of course not provided in the cell itself.

The structure of the cell according to the invention also offers the facility to adjourn reading until a time considered appropriate by the designer, in particular by modifying the voltage of the well 20 or 20a. Thus it is possible in particular to eliminate thermal noise and shot noise from the diode leakage current, which risk affecting the wanted signal obtained.

Figure 5:
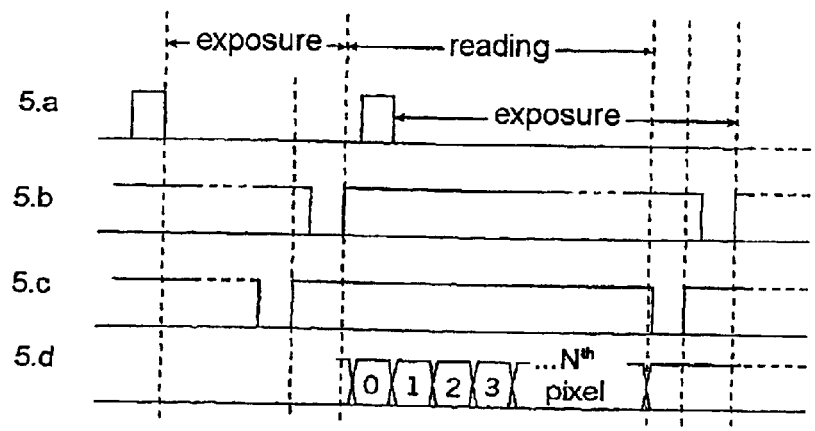
FIG. 5 is a diagram of the signals in the cell from FIG. 3.

FIG. 5 is a diagram of the control signals for the FIG. 1 cell. The control signal of the transistor 2 is shown at (a); it determines the exposure time. The control signal of the shutter transistor 6 is shown at (b). The control signal of the reset transistor 14 is shown at (c), and the succession of values read from the various cells (or "pixels") of the sensor is shown at (d).

Figure 6:
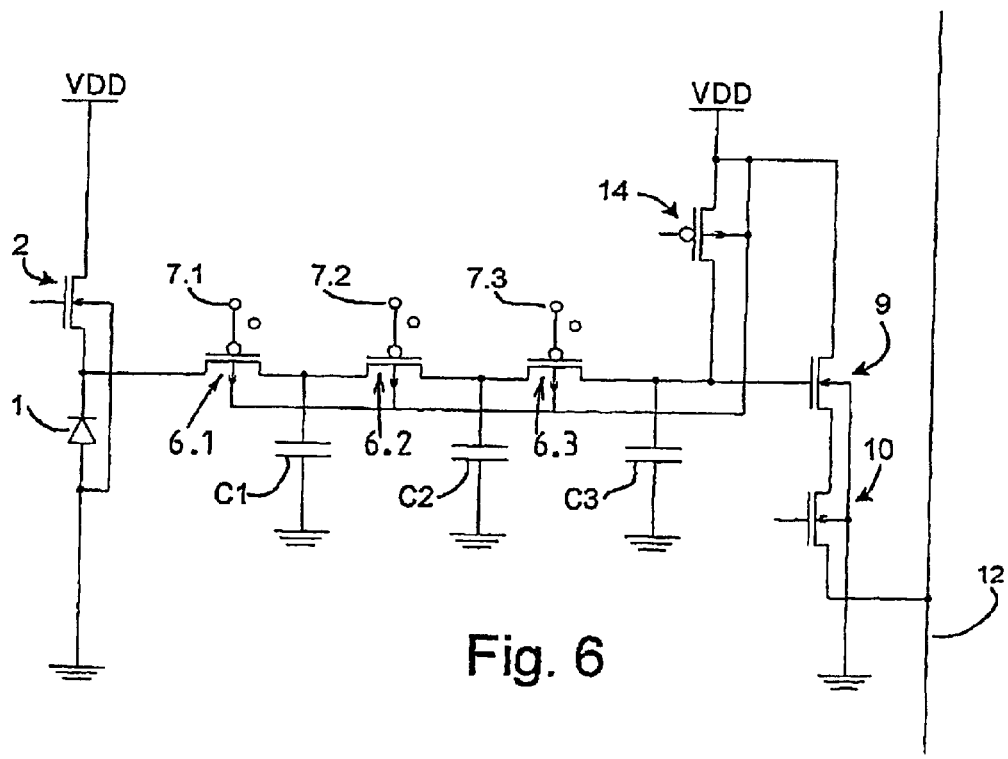
FIG. 6 shows another embodiment of a cell according to the invention.

FIG. 6 shows another embodiment of a cell according to the invention. In this variant, the shutter transistor 6 in fact comprises a plurality of transistors (6.1 to 6.3), each associated with storage means (C1 to C3) and being controlled by a voltage applied to its gate (7.1 to 7.3).

There is claimed:

1. An active cell for a CMOS technology photosensitive sensor comprising a plurality of said cells arranged in an addressable matrix in which the cells undergo successive working cycles consisting at least in an exposure phase for detecting the quantity of light that impinges on them followed by a scanning phase during which the luminance information due to that quantity of light is extracted from the cell, said cells luminance information due to that quantity of light is extracted from the cell, said cells comprising:

a photosensitive element, first addressable means for activating/deactivating said photosensitive element after exposure phase, second addressable means for extracting from the cell, during said scanning phase, the luminance signal generated by said photosensitive element, third addressable means for transferring said luminance signal from said photosensitive element to said second addressable means;

memory means for retaining said luminance signal between the exposure phase and the time at which said cell is addressed to activate said second addressable means, and fourth addressable means for discharging said memory means after the cell reading phase, said photosensitive element and said first, second, third, and fourth addressable means being implemented in the form of semiconductor components integrated into a substrate with predetermined conductivity types, wherein said third and fourth addressable means are placed in at least one well formed in the substrate, said at least one well having a first conductivity type opposite of that of the substrate, which has a second conductivity type and in which the photosensitive element is produced, wherein said fourth addressable means are implanted in said well and wherein a diffusion region of the second conductivity type is formed in said well and connected to a bias voltage source.

2. A cell according to claim 1, wherein said first conductivity type is the p-type and the second conductivity type is the n-type.

3. A cell according to claim 1, wherein said first conductivity type is the n-type and the second conductivity type is the p-type.

4. A cell according to claims 1, wherein said third means consist of a plurality of transistors connected in series and each controlled by a fixed voltage.

5. A cell according to claim 1, wherein the bias voltage applied to said bias voltage source is adjustable.

* * * * *